(12) United States Patent
Wu et al.

(10) Patent No.: US 10,910,316 B2
(45) Date of Patent: Feb. 2, 2021

(54) ELECTRONIC DEVICE

(71) Applicant: InnoLux Corporation, Miao-Li County (TW)

(72) Inventors: Yuan-Lin Wu, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/391,303

(22) Filed: Apr. 23, 2019

(65) Prior Publication Data

US 2020/0343190 A1    Oct. 29, 2020

(51) Int. Cl.
| *H01L 23/538* | (2006.01) |
| *H01L 25/13* | (2006.01) |
| *H01L 51/00* | (2006.01) |
| *H01L 27/32* | (2006.01) |

(52) U.S. Cl.
CPC ...... *H01L 23/5387* (2013.01); *H01L 23/5384* (2013.01); *H01L 25/13* (2013.01); *H01L 27/3213* (2013.01); *H01L 51/0097* (2013.01)

(58) Field of Classification Search
CPC . H01L 23/5387; H01L 25/13; H01L 51/0097; H01L 23/5384; H01L 27/3213
USPC ......................................................... 257/89
See application file for complete search history.

(56) References Cited

U.S. PATENT DOCUMENTS

| 2010/0317132 | A1 | 12/2010 | Rogers |
| 2013/0041235 | A1 | 2/2013 | Rogers |
| 2014/0144480 | A1 | 5/2014 | Lee |
| 2016/0049602 | A1* | 2/2016 | Kim ................... H01L 27/3244 |
| | | | 257/40 |
| 2016/0211471 | A1 | 7/2016 | Kwon |
| 2016/0293571 | A1* | 10/2016 | Yoon ..................... H01L 25/048 |
| 2017/0249886 | A1 | 8/2017 | Choi |
| 2018/0176352 | A1 | 6/2018 | Shin |

FOREIGN PATENT DOCUMENTS

EP          3 660 818 A1    6/2020

* cited by examiner

*Primary Examiner* — Karen Kusumakar
*Assistant Examiner* — Adam S Bowen
(74) *Attorney, Agent, or Firm* — Winston Hsu

(57) ABSTRACT

An electronic device capable of being stretched from a first status to a second status includes a stretchable substrate stretchable in a stretching direction and a first pixel disposed on the stretchable substrate. The first pixel includes a first sub-pixel and a second sub-pixel. The first sub-pixel and the second sub-pixel arrange along a first direction when the electronic device is in the first status, and the first sub-pixel and the second sub-pixel arrange along a second direction when the electronic device is in the second status, wherein the first direction and the second direction form different angles with respect to the stretching direction.

20 Claims, 16 Drawing Sheets

ELECTRONIC DEVICE

BACKGROUND OF THE DISCLOSURE

1. Field of the Disclosure

The present disclosure is related to a stretchable electronic device, and more particularly, to a stretchable electronic device that includes pixels.

2. Description of the Prior Art

In recent years, display devices have become more and more important for being applied to various applications, such as smartphones, tablet computers, notebooks, and electronic book readers, and wearable devices, such as smart watches. The manufacturers still keep on developing new types of display devices.

SUMMARY OF THE DISCLOSURE

One of the objectives of the present disclosure is to provide a stretchable electronic device with a more even visual perception.

According to an embodiment of the present disclosure, an electronic device is provided. The electronic device is capable of being stretched from a first status to a second status and includes a stretchable substrate stretchable in a stretching direction and a first pixel disposed on the stretchable substrate. The first pixel includes a first sub-pixel and a second sub-pixel. The first sub-pixel and the second sub-pixel are arranged along a first direction when the electronic device is in the first status, and the first sub-pixel and the second sub-pixel are arranged along a second direction when the electronic device is in the second status, wherein the first direction and the second direction form different angles with respect to the stretching direction.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

The term "stretching/stretchable" in the present disclosure indicates that an object can be deformed when an external stress and/or force is applied thereto, and the deformation may include the variation of area, length, width, thickness, and/or curvature in any direction of the object, but not limited thereto. For example, an enlargement of the length of the object or a reduction of the length of the object may belong to the term "stretching/stretchable" mentioned in the present disclosure.

It should be noted that the technical features in different embodiments described in the following can be replaced, recombined, or mixed with one another to constitute another embodiment without departing from the spirit of the present disclosure.

Figure 1:
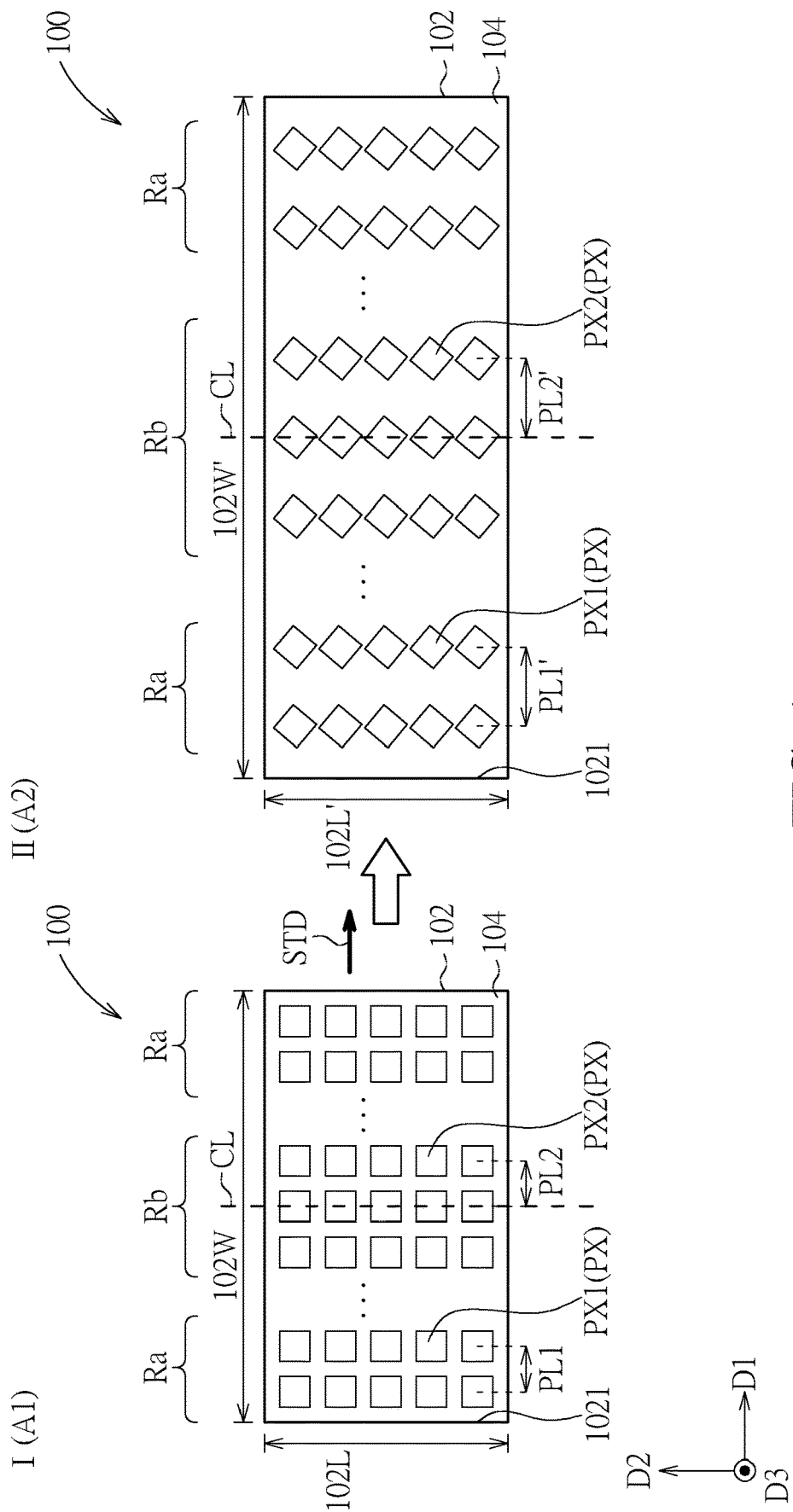
FIG. 1 is a schematic diagram illustrating different statuses of an electronic device according to a first embodiment of the present disclosure.
Figure 2:
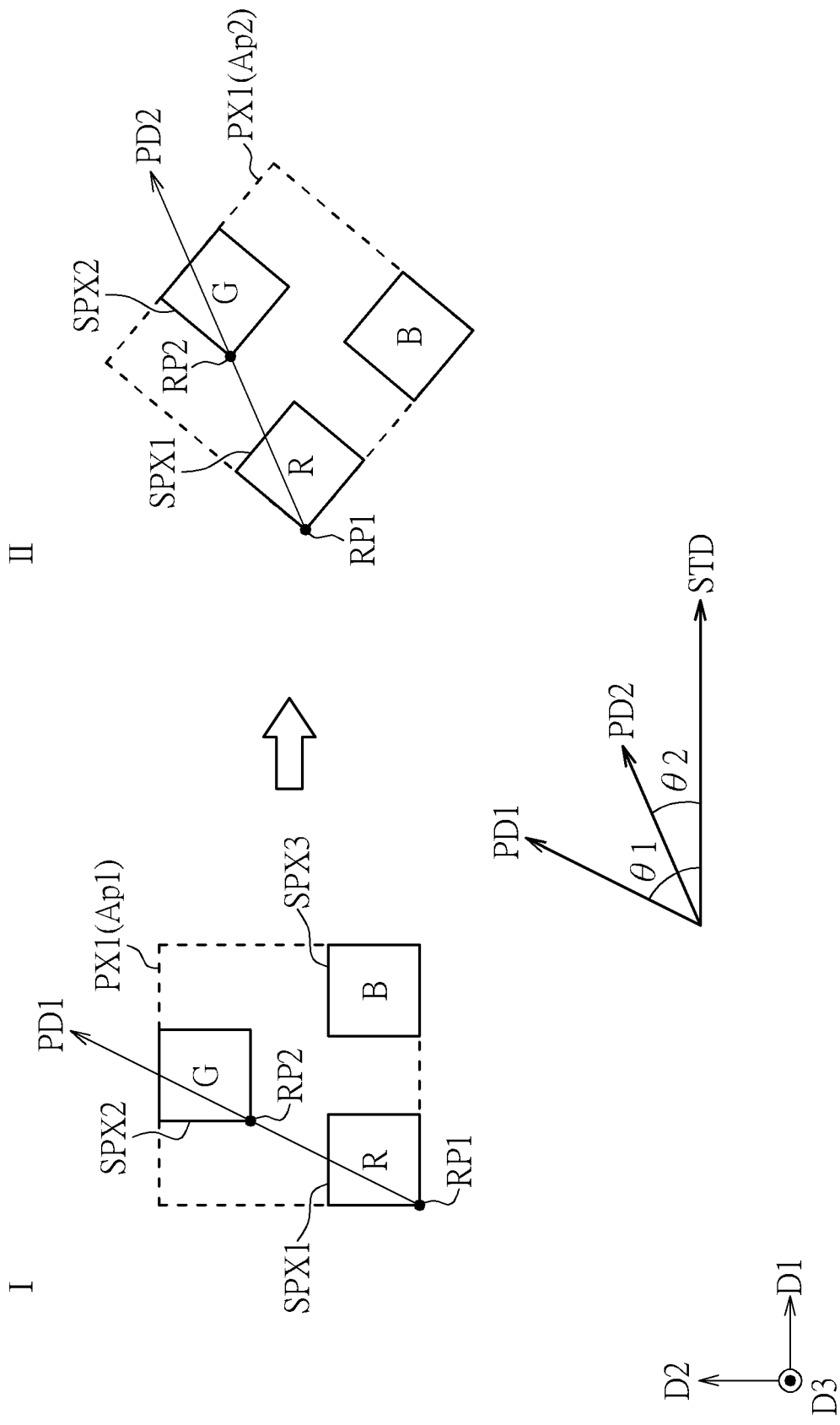
FIG. 2 is an enlargement schematic diagram illustrating the first pixel of the electronic device shown in FIG. 1 in different statuses.

Referring to FIG. 1 and FIG. 2, FIG. 1 is a schematic diagram illustrating different statuses of an electronic device according to a first embodiment of the present disclosure and FIG. 2 is an enlargement schematic diagram illustrating the first pixel of the electronic device shown in FIG. 1 in different statuses. The electronic device 100 of the first embodiment of the present disclosure includes a stretchable substrate 102 and a plurality of pixels PX disposed on the stretchable substrate 102. For example, the plurality of pixels PX can be arranged in matrix, that is, can include a plurality of columns and a plurality of rows. The stretchable substrate 102 can be stretched along various directions, thus the electronic device 100 can be stretched from a first status I to a second status II. The status of the electronic device 100 may indicate the area, shape, and/or display mode of the electronic device 100, but not limited thereto. For example, in some embodiments, the stretchable substrate 102 may be stretched along a horizontal direction D1 illustrated in FIG. 1. In the first status I, the electronic device 100 is not stretched. In such status I, the stretchable substrate 102 has a width 102W, a length 102L, and a substrate area A1. The electronic device 100 can be stretched along a stretching direction STD, but not limited thereto. After the electronic device 100 is stretched, it is in the second status II. In such status II, the stretchable substrate 102 has a stretched width 102W', a stretched length 102L', and a stretched substrate area A2. The stretched substrate area A2 may be different from the substrate area A1. For example, the stretched substrate area A2 is greater than the substrate area A1 and the stretched width 102W' is greater than the width 102W, but the stretched length 102L' may be approximately equal to the length 102L.

In some other embodiments, the stretchable substrate 102 may be stretched along two directions, such as along both the horizontal direction D1 and the vertical direction D2, and therefore both the width 102W and the length 102L may be enlarged after stretching. In some other embodiments, the stretchable substrate 102 may be stretched along multiple directions (such as 3 directions). For example, the stretchable substrate 102 may be stretched along its edges and also along a direction D3 parallel to the normal line of the surface of the stretchable substrate 102. After stretching, the electronic device 100 may become a curved device that has at least one curved portion. The stretchable substrate 102 may include polymer material, such as polyimide (PI) and polyethylene terephthalate (PET), or any other suitable materials, such as a material having elasticity or being stretchable.

The electronic device 100 may have at least an edge region Ra and a middle region Rb disposed along the direction D1. The edge region Ra is near a fringe 1021 of the stretchable substrate 102. The middle region Rb is a region passed through by a central line CL of the stretchable substrate 102. In FIG. 1, two edge regions Ra are illustrated and the middle region Rb is situated between the two edge regions Ra in the direction D1. The plurality of pixels PX may be disposed on the stretchable substrate 102 corresponding to both the edge regions Ra and the middle region Rb. For example, the plurality of pixels PX can include a plurality of first pixels PX1 in the left edge region Ra, and a plurality of second pixels PX2 in the middle region Rb. In other words, the first pixel PX1 corresponding to the left edge region Ra is closer to the fringe 1021 than the second pixel PX2, and the second pixel PX2 corresponding to the middle region Rb is closer to the central line CL than the first pixel PX1.

Still referring to FIG. 1, when the electronic device 100 is in the first status I, two of the first pixels PX1 adjacent to each other have a first distance PL1 in the direction D1, and two of the second pixels PX2 adjacent to each other have a second distance PL2 in the direction D1. The above-mentioned distance between pixels PX can be measured based on the center of the pixels PX. The first distance PL1 may be the same as the second distance PL2 in some embodiments, but not limited thereto. The first distance PL1 may not be equal to the second distance PL2 in some other embodiments. When the electronic device 100 is stretched to be in the second status II, one of the first pixels PX1 has a first stretched distance PL1' from an adjacent first pixel PX1, and one of the plurality of second pixels PX2 has a second stretched distance PL2' from an adjacent second pixel PX2. The first stretched distance PL1' may be greater than the first distance PL1. The second stretched distance PL2' may be greater than the second distance PL2. In addition, the first stretched distance PL1' may be the same as or different from the second stretched distance PL2'. As shown in FIG. 1, the first stretched distance PL1' may be the same as the second stretched distance PL2' for instance.

Figure 3:
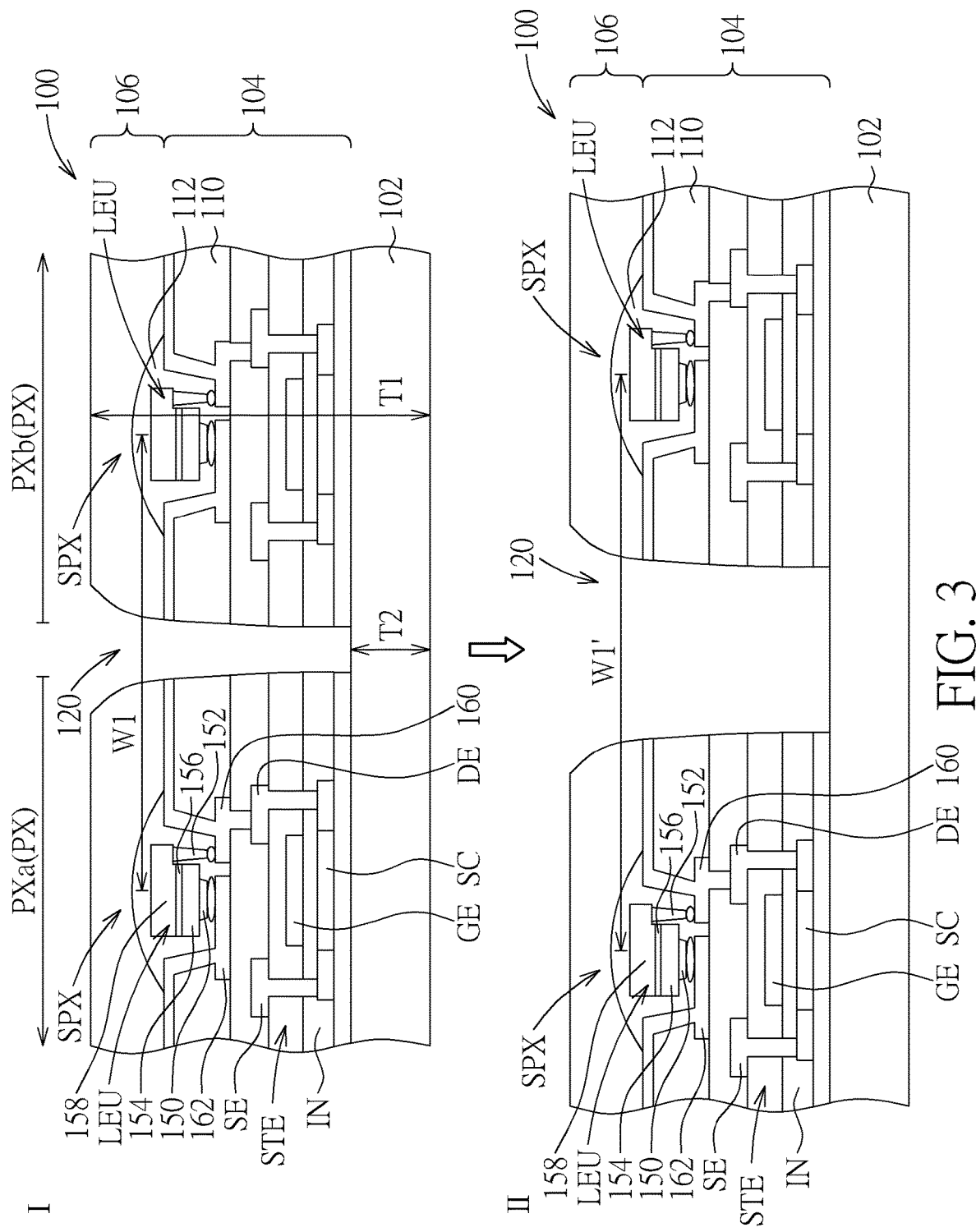
FIG. 3 is a partial schematic sectional-view diagram of different statuses of the electronic device shown in FIG. 1.

Referring to FIG. 3, the electronic device 100 may include a circuit layer 104 disposed on the stretchable substrate 102, and each of the pixels PX may be a part of the circuit layer 104. The circuit layer 104 may include a plurality of electric elements, such as, but not limited to, circuits, wires, electrodes, switch elements, driving elements, light emitting elements, and/or any other suitable elements. In some embodiments, the electronic device 100 may be a display device or a display panel, and can display images. For example, one pixel PX may include any electric element(s) that can produce light, such as the primary lights (red light, blue light, and green light), for displaying images. One pixel PX can include at least two sub-pixels and may be defined as a smallest unit which comprises a group of sub-pixels shifting and/or rotating as a whole. As shown in FIG. 2, taking the first pixel PX1 as an example, the first pixel PX1 may include a first sub-pixel SPX1 and a second sub-pixel SPX2, and may further include a selective third sub-pixel SPX3. The first sub-pixel SPX1, second sub-pixel SPX2, and third sub-pixel SPX3 may be a red sub-pixel (marked as the symbol "R" in the drawings hereinafter), a green sub-pixel (marked as the symbol "G" in the drawings hereinafter), and a blue sub-pixel (marked as the symbol "B" in the drawings hereinafter) respectively, but not limited thereto. One pixel PX may include a number of sub-pixels more than three that can produce one or more kinds of color lights.

Still referring FIG. 2, when the electronic device 100 is in the first status I, the first sub-pixel SPX1 and the second sub-pixel SPX2 are arranged along a first direction PD1. In the first status I, the first direction PD1 may be defined as an extending direction of the connection line of a first reference point RP1 of the first sub-pixel SPX1 and a second reference point RP2 of the second sub-pixel SPX2. After the electronic device 100 is stretched and in the second status II, a second direction PD2 is defined as an extending direction of the connection line of the same reference point RP1 of the first sub-pixel SPX1 and the same reference point RP2 of the second sub-pixel SPX2. In other words, the first sub-pixel SPX1 and the second sub-pixel SPX2 are arranged along the second direction PD2 when the electronic device 100 is in the second status II. As shown in FIG. 2, the first reference point RP1 can be the point at the lower left corner of the first sub-pixel SPX1, and the second reference point RP2 can be the point at the lower left corner of the second sub-pixel SPX2. However, in some embodiments, the first reference point RP1 and the second reference point RP2 can be at other positions, only if the first reference point RP1 and the second reference point RP2 are located in the same pixel. For example, in some embodiments, although not shown in figures, the first reference point RP1 can be the point at the upper right corner of the first sub-pixel SPX1, and the second reference point RP2 can be the point at the center of the second sub-pixel SPX2. In some embodiments, although not shown in figures, the first reference point RP1 can be the point at the lower left corner of the first sub-pixel SPX1, and the second reference point RP2 can be the point at the upper right corner of the second first sub-pixel SPX1 SPX2. When defining the first direction PD1 and the second direction PD2, the connection line is depicted by connecting the same reference point RP1 and the same reference point RP2 in the same pixel.

As shown in FIG. 2, the first direction PD1 and the second direction PD2 respectively form different angles with respect to the stretching direction STD. For example, the first direction PD1 forms a first angle θ1 with respect to the stretching direction STD, the second direction PD2 forms a second angle θ2 with respect to the stretching direction STD, and an absolute difference between the first angle θ1 and the second angle θ2 can be greater than zero and less than or equal to 120 degrees in some embodiments, which means the relation of the first angle θ1 and the second angle θ2 meets the following equation:

0°<|θ1−θ2|≤120°.

In some embodiments, an absolute difference between the first angle θ1 and the second angle θ2 can be greater than zero and less than or equal to 60 degrees, greater than zero and less than 30 degrees, greater than zero and less than 15 degrees, or greater than zero and less than 5 degrees. In other words, when the electronic device 100 is stretched from the first status I to the second status II, at least one of the pixels PX is rotated or twisted, such as the first pixel PX1 mentioned above. As shown in FIG. 1, in some embodiments, the pixels PX corresponding to the edge regions Ra (such as the first pixel PX1) and the pixels PX corresponding to the middle region Rb (such as the second pixel PX2) may both rotate or twist when the electronic device 100 is in the second status II, with respect to the first status I, but not limited thereto. For example, the rotating degrees of the first pixel PX1 and the second pixel PX2 may be the same. However, in some other embodiments, not all of the pixels PX have identical rotating degrees. For example, the pixels PX may have different rotating degrees based on their locations on the stretchable substrate 102. For example, after stretching and in the second status II, the pixels PX in the edge region Ra and the pixels PX in the middle region Rb may have different rotating degrees. In a conventional stretchable electronic device, after stretching, uneven visual perception may occur because the pitch of the pixel is changed. In some embodiments, after stretching, by the design that the pixels PX are rotated or twisted, the uneven visual perception caused by stretching may be more indistinct, so as to improve the display performance.

In some embodiments, when the electronic device 100 is stretched, the area of the pixels PX will remain unchanged. That is to say, referring to FIG. 2, the first pixel area (Ap1) of one first pixel PX1 in the first status I can be substantially the same as the second pixel area (Ap2) of the first pixel PX1 in the second status II. In addition, in some embodiments, when the electronic device 100 is stretched, the area of the pixels PX may change. That is to say, the first pixel PX1 may have a first pixel area Ap1 in the first status I, and have a second pixel area Ap2 in the second status II, and the first pixel area Ap1 is different from, for example, less than, the second pixel area Ap2. As mentioned above, one pixel PX can include at least two sub-pixels and may be defined as a smallest unit which comprises a group of sub-pixels shifting and/or rotating as a whole. In detail, referring to FIG. 2, the region of one first pixel PX1 may be defined by the outermost edges of the light emitting regions of the sub-pixels, that is, the region surrounded by the dash line. Thus, the area of the first pixel PX1 is the area of the region surrounded by the dash line.

In some embodiments, a ratio of the first pixel area Ap1 to the substrate area A1 in the first status I may be greater than a ratio of the second pixel area Ap2 to the stretched substrate area A2 in the second status II. In such case, the total stretching degree of the stretchable substrate 102 is greater than the stretching degree of each pixel PX, and the portions of the stretchable substrate 102 between the pixels PX may contribute the most stretching effect of the electronic device 100.

Referring to FIG. 3, FIG. 3 is a partial schematic sectional-view diagram of different statuses of the electronic device shown in FIG. 1. FIG. 3 shows two adjacent pixels PX. In each pixel PX, only one sub-pixel SPX is shown for simplicity. When the electronic device 100 is a display device, in the circuit layer 104, the pixels PX may include one or more light emitting elements LEU, and one or more switching elements STE (or driving elements) electrically connected to the light emitting elements LEU. When the electronic device 100 is stretched from the first status I to the second status II, the total area of the circuit layer 104 may also change with correspondence to the stretchable substrate 102. The light emitting element LEU may be an inorganic light emitting diode (LED), an organic light emitting diode (OLED), or any other suitable elements. The inorganic LED can be a mini LED or a micro LED. In some embodiments, the size of a mini-LED can be in a range from 100 μm to 300 μm. In some embodiments, the size of a micro-LED can be in a range from 1 μm to 100 μm. The switching element STE may be a thin film transistor, but not limited thereto. In detail, the inorganic light emitting diode (LED) may be flip chip-type or vertical-type. One light emitting element LEU may include a first electrode 150, a second electrode 152, a first semiconductor layer 154, a light emitting layer 156, and a second semiconductor layer 158. The light emitting layer 156 may be, but not limited to, a multiple quantum well (MQW) layer for example. The first electrode 150 may be electrically connected to a common electrode through a bonding pad 162. In addition, when the switching element STE is a thin film transistor, it may include a gate GE, a source SE, a drain DE, and a semiconductor layer SC, wherein the source SE and the drain DE are electrically connected to the semiconductor layer SC and an insulating layer IN is positioned between the gate GE and the semiconductor layer SC. The source SE may be electrically connected to a signal line for example. The drain DE may be electrically connected to a connecting pad 160 or a connecting layer that is electrically connected to the corresponding light emitting element LEU.

The circuit layer 104 may further include a pixel defining layer 110 positioned between adjacent light emitting elements LEU and a protection layer 112 covering the light emitting elements LEU. The pixel defining layer 110 may define the light emitting region or the region of one sub-pixel SPX. The light emitting elements LEU is disposed in the region of the sub-pixel SPX. The protection layer 112 can protect the light emitting elements LEU from air and moisture for example. The electronic device 100 may further include a functional layer 106 covering the circuit layer 104.

The functional layer 106 may include a touch layer, a cover layer, an anti-refection layer, a protection layer, an insulating layer, or combinations thereof. The electronic device 100 may include a plurality of gaps 120 passing through the circuit layer 104 and the functional layer 106, between adjacent sub-pixels SPX. In some embodiments, the gap 120 may be formed between adjacent two sub-pixels SPX, in which the two sub-pixels SPX are disposed in two different pixels PX respectively, for example, disposed in pixels PXa and PXb respectively as shown in FIG. 3. The total thickness T1 of the electronic device 100 corresponding to the sub-pixels SPX may be greater than the total thickness T2 of the electronic device 100 corresponding to the gaps 120. In some embodiments, the electronic device 100 may further include a filler disposed in the gaps 120. The filler can be inorganic insulating material, organic insulating material, or combinations thereof. In some embodiments, the filler can be elastic material or adhesive material.

Still referring to FIG. 3, when the electronic device 100 is stretched from the first status I to the second status II, the distance (or pitch) between two adjacent sub-pixels SPX may also be stretched. In the first status I, the distance between two adjacent sub-pixels SPX is represented as W1, wherein the distance W1 is measured from a center of a sub-pixel SPX to a center of another adjacent sub-pixel SPX. After the electronic device 100 is stretched to the second status II, the two adjacent sub-pixels SPX have a stretched distance W1' therebetween, and the stretched distance W1' may be greater than the distance W1. Further, the gap 120 between adjacent sub-pixels SPX may also be widened in the second status II.

Figure 4:
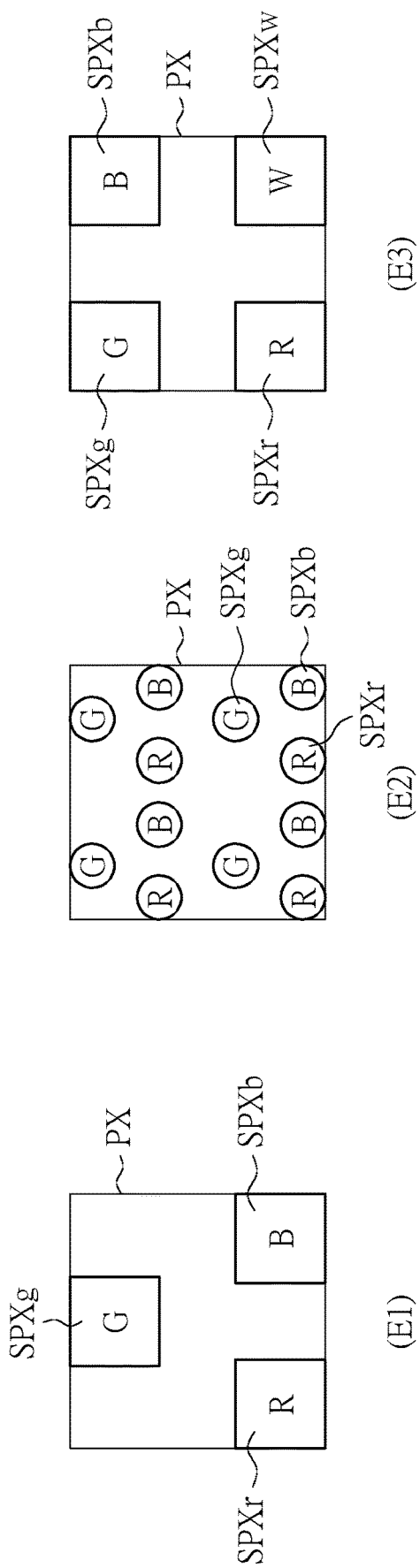
FIG. 4 is a schematic diagram of different arrangements of one pixel according to the present disclosure.
Figure 4:
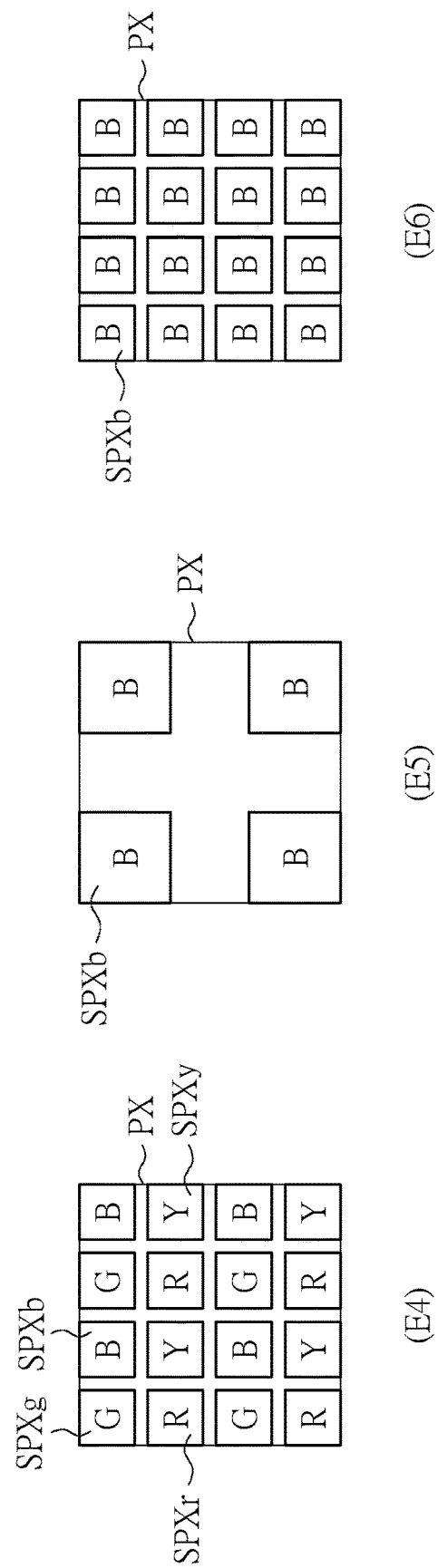

Referring to FIG. 4, FIG. 4 is a schematic diagram of different arrangements of one pixel according to the present disclosure. As mentioned above, one pixel PX refers to a smallest unit of a group of sub-pixels that can rotate as a whole when the electronic device 100 is stretched. The region of one pixel PX may be defined by the outermost edges of the light emitting regions of the sub-pixels which are included in the pixel PX. One pixel PX can include at least two sub-pixels. In some embodiments, one pixel can include a plurality of sub-pixels. For example, in the first example (E1), the pixel PX may include a red sub-pixel SPXr (also represented by the letter "R"), a green sub-pixel SPXg (also represented by the letter "G"), and a blue sub-pixel SPXb (also represented by the letter "B"), and the area of the pixel PX may be a rectangle or a square that surrounds the sub-pixels and has an boundary that overlaps at least a point of the edge of the light emitting region of each of the outermost sub-pixels SPXr, SPXg, and/or SPXb. In the example (E2), one pixel PX includes four red sub-pixels SPXr, four green sub-pixels SPXg, and four blue sub-pixels SPXb, and the light emitting regions of these sub-pixels have round shape. The boundary of the pixel PX may be defined as a rectangle or a square having an edge that is tangent to the edge of the light emitting regions of the outermost sub-pixels. In the example (E3), one pixel PX may include one red sub-pixel SPXr, one green sub-pixel SPXg, one blue sub-pixel SPXb, and one white sub-pixel SPXw. In another example, the white sub-pixel SPXw may be replaced by another color sub-pixel, such as a yellow sub-pixel SPXy. In the example (E4), one pixel PX may include four red sub-pixels SPXr, four green sub-pixels SPXg, four blue sub-pixels SPXb, and four yellow sub-pixels SPXy. Furthermore, one pixel PX may include a plurality of sub-pixels that produce the same color light. As an example, one pixel PX may include four blue sub-pixels SPXb in the example (E5) or sixteen blue sub-pixels SPXb in the example (E6). In other examples, one pixel PX may include a plurality of white sub-pixels SPXw. It should be noted that the combinations of the sub-pixels in one pixel PX is not limited to the above, and these and other combinations of the sub-pixels in a pixel PX defined above may be applied to any embodiments or variant embodiments of the present disclosure.

Figure 5:
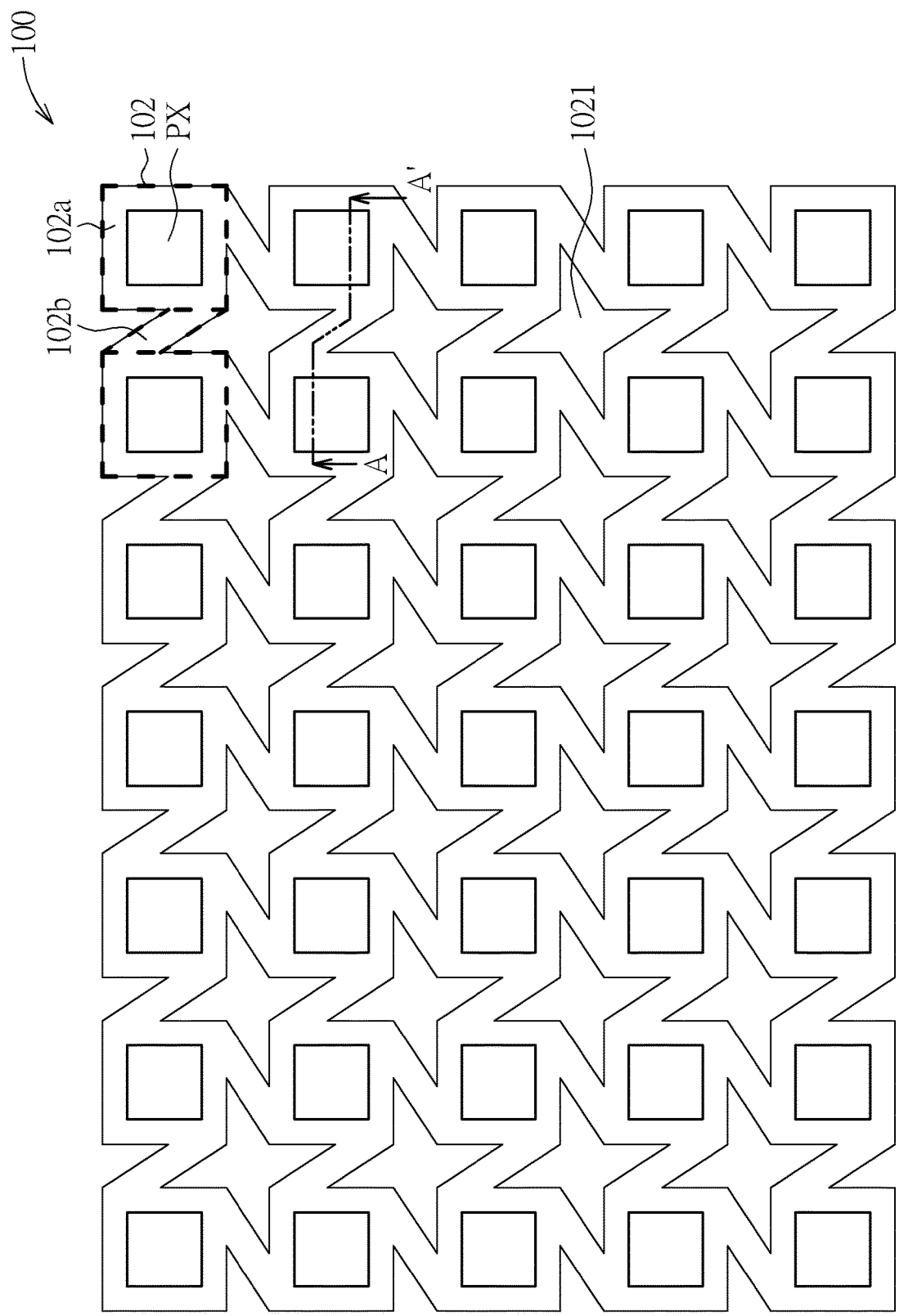
FIG. 5 is a partial top-view of an electronic device according to a variant embodiment of the first embodiment.
Figure 6:
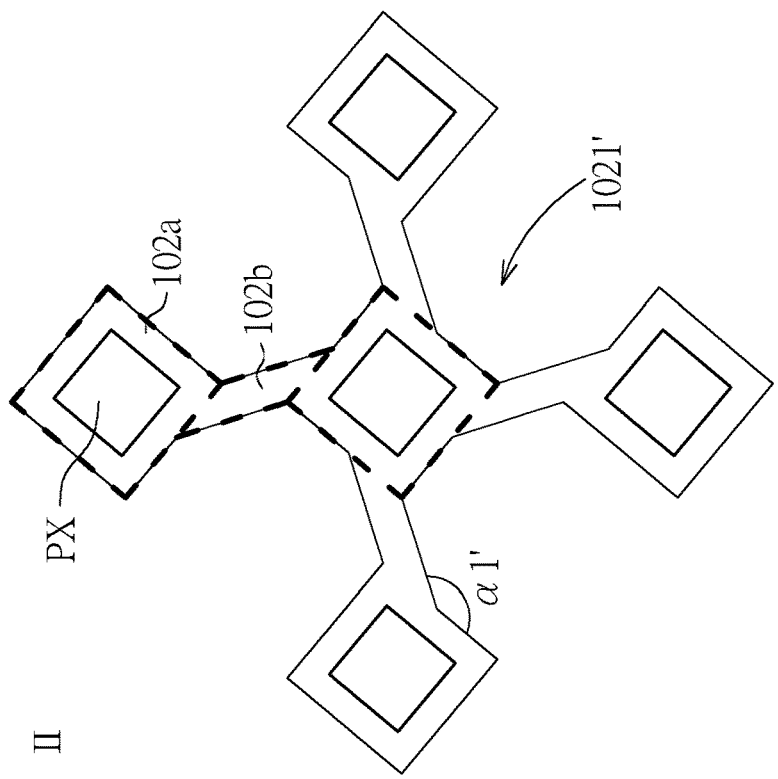
FIG. 6 is a partial enlargement diagram of the electronic device shown in FIG. 5.
Figure 6:
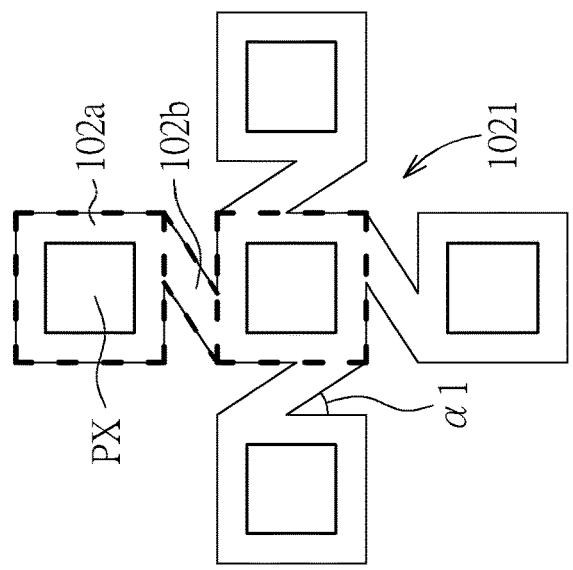
Figure 7:
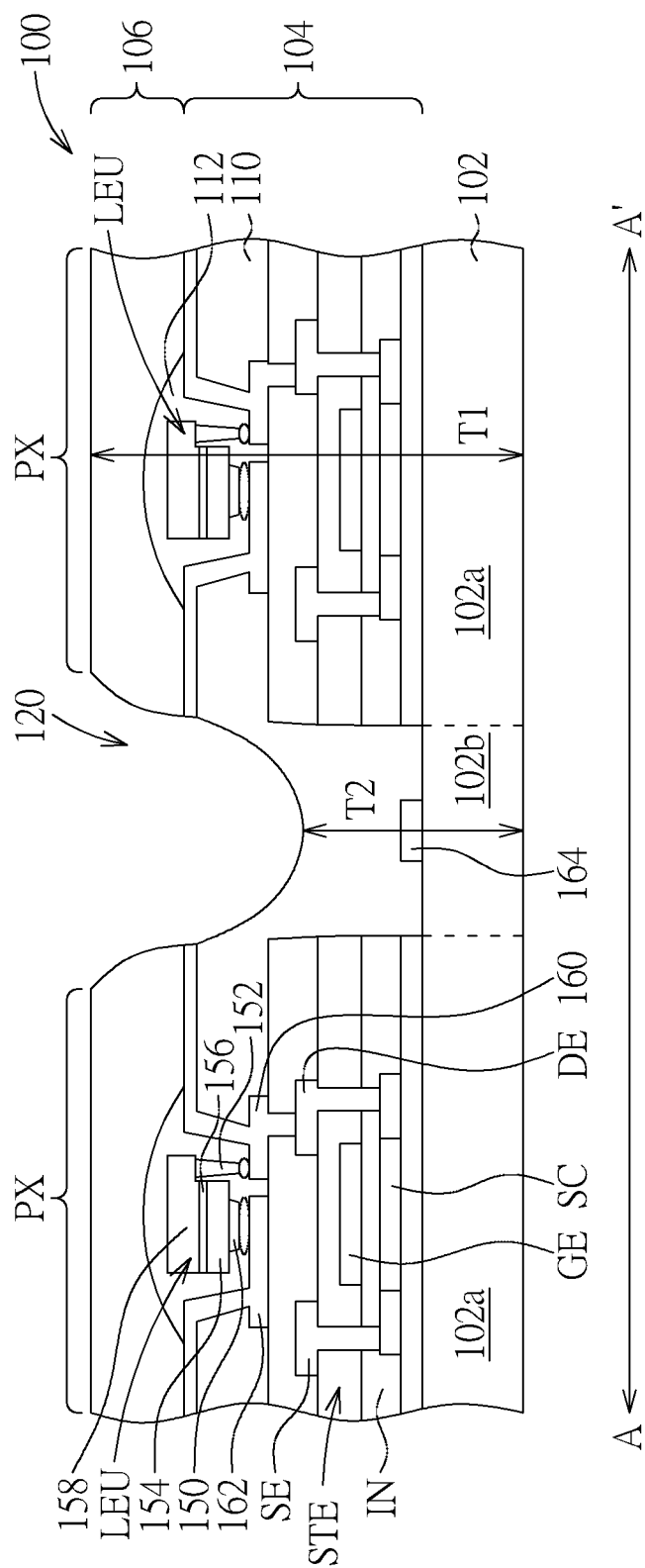
FIG. 7 is a schematic sectional diagram of the electronic device along the cross-line A-A' in FIG. 5.

Referring to FIG. 5, FIG. 6 and FIG. 7, FIG. 5 is a partial top-view of an electronic device according to a variant embodiment of the first embodiment, FIG. 6 is a partial enlargement diagram of the electronic device shown in FIG. 5, wherein FIG. 6 shows a part of the stretchable substrate when the electronic device is in different statuses, and FIG. 7 is a schematic sectional diagram of the electronic device along the cross-line A-A' in FIG. 5. In the variant embodiment shown in FIG. 5 and FIG. 6, the stretchable substrate 102 includes a plurality of pixel parts 102a and a plurality of connecting parts 102b, wherein one of the plural connecting parts 102b is disposed between two adjacent ones of the plural pixel parts 102a. In other words, adjacent pixel parts 102a are connected by at least one connecting part 102b. The pixels PX are disposed on the pixel parts 102a. For example, one pixel PX and its light emitting elements LEU are disposed on the stretchable substrate 102 within one of the plurality of pixel parts 102a. When the electronic device 100 is stretched, the stretchable substrate 102 will be deformed and the connecting parts 102b will also be stretched, such that the pixel parts 102a may rotate accordingly and the pixel PX in one pixel part 102a can be rotated together as a whole unit. As shown in FIG. 6, a connecting part 102b and a connected pixel part 102a may have an included angle $\alpha 1$ when the electronic device 100 is in the first status I, and the connecting part 102b and the pixel part 102a may have a stretched included angle $\alpha 1'$ when the electronic device 100 is in the second status II. The stretched included angle $\alpha 1'$ is different from the included angle $\alpha 1$, and the stretched included angle $\alpha 1'$ may be greater than the included angle $\alpha 1$. As shown in FIG. 6, the included angle $\alpha 1$ may be an acute angle; however, the stretched included angle $\alpha 1'$ may be an obtuse angle, but not limited thereto. In addition, as shown in FIG. 5 and FIG. 6, the stretchable substrate 100 may have a plurality of openings 1021 disposed between adjacent pixels PX. The openings 1021 are formed by the pixel parts 102a and the connecting parts 102b. In other words, the openings 102a are surrounded by the pixel parts 102a and the connecting parts 102b connected to each other. The openings 1021 may be through holes that pass through the whole thickness of the stretchable substrate 102 in some embodiments, but not limited thereto. The openings 1021 may be, but not limited to, polygons as shown in FIG. 5 and are deformable to form the openings 1021', for instance, when the electronic device 100 is stretched from the first status I to the second status II.

FIG. 7 is a schematic sectional diagram of the electronic device along the cross-line A-A' in FIG. 5. Referring to FIG. 7, the light emitting elements LEU of the pixels PX are disposed on the pixel parts 102a of the stretchable substrate 102, and the gaps 120 of the electronic device 100 may correspond to the connecting parts 102b and/or the openings 1021 shown in FIG. 5. The functional layer 106 covers the plurality of pixel parts 102a and the light emitting elements LEU but exposing the connecting parts 102b. The circuit layer 104 may further include a plurality of wires 164 (FIG. 7 only shows one wire 164 for illustration). Some of the wires 164 may be disposed on the surfaces of the connecting parts 102b. In some embodiments, the wires 164 may be disposed further on the surfaces of the pixel parts 102a. The wires 164 may be any conductive lines, such as signal lines, data lines, scan lines and/or any other lines that can deliver signals. In this variant embodiment, the pixel defining layer 110 extends from the pixel parts 102*a* to the connecting parts 102*b* to cover the connecting parts 102*b* and the wires 164, thus the pixel defining layer 110 may protect the wires 164. In addition, the total thickness T1 of the electronic device 100 corresponding to the pixel parts 102*a* is greater than the total thickness T2 of the electronic device 100 corresponding to the connecting parts 102*b*.

Figure 8:
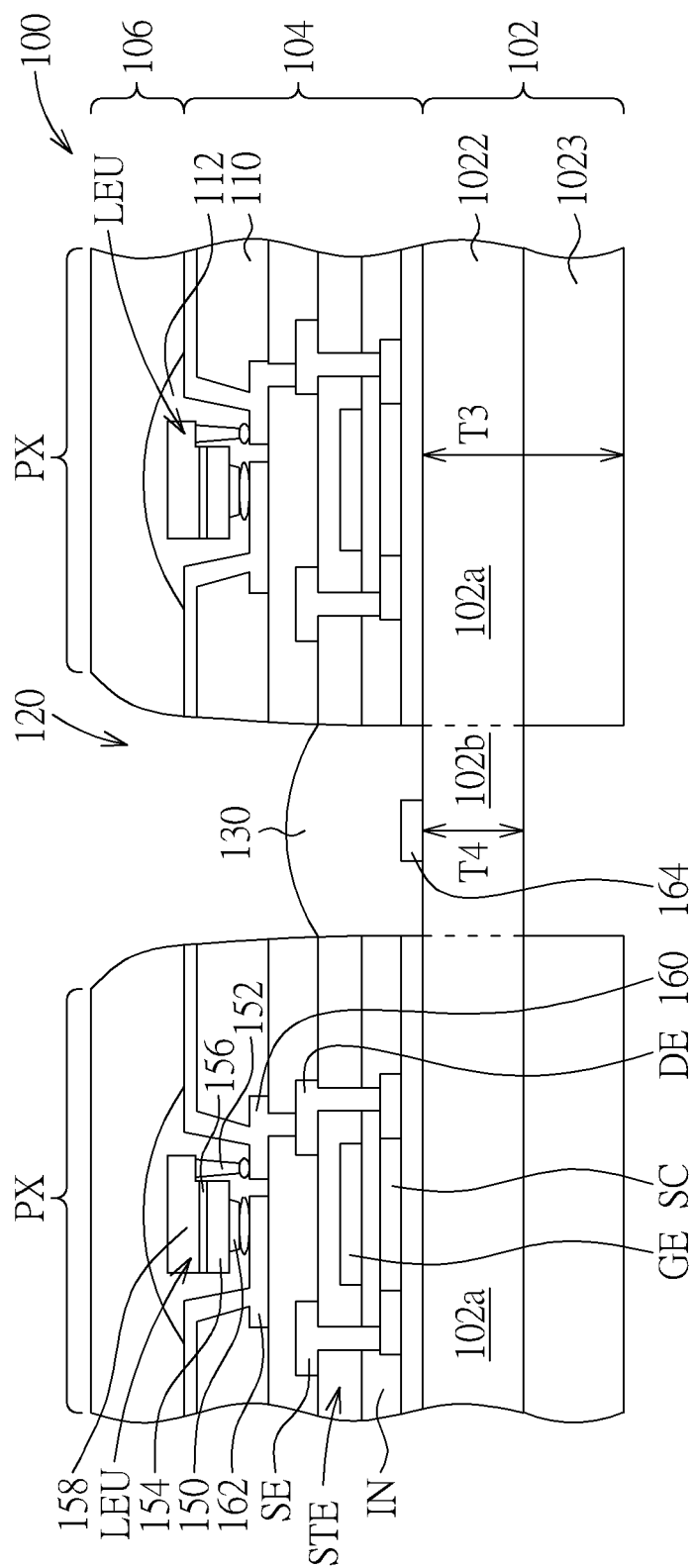
FIG. 8 is a partial enlarged sectional view of an electronic device according to another variant embodiment of the first embodiment of the present disclosure.

Referring to FIG. 8, FIG. 8 is a partial enlarged sectional view of an electronic device 100 according to another variant embodiment of the first embodiment of the present disclosure. In this variant embodiment, the electronic device 100 further includes a protecting layer 130 disposed on the plurality of connecting parts 102*b* and between two adjacent pixel parts 102*a*. The protecting layer 130 may be filled in the gaps 120, but not limited thereto. The protecting layer 130 may protect the wires 164 from air and moisture for instance. In addition, the stretchable substrate 102 may include a stretchable base 1022 and a supporting film 1023 attached to the stretchable base 1022. The stretchable base 1022 may have the same shape and functionality as the stretchable substrate 102 mentioned in FIG. 5 and FIG. 6, and the supporting film 1023 may be disposed corresponding to the pixels PX to form the pixel parts 102*a* of the stretchable substrate 102 together with the stretchable base 1022. In contrast, the connecting parts 102*b* may be composed of the stretchable base 1022 without the supporting film 1023. Therefore, the total thickness T3 of the pixel parts 102*a* of the stretchable substrate 102 is greater than the total thickness T4 of the connecting parts 102*b* of the stretchable substrate 102. The structure of the stretchable substrate 102, the circuit layer 104 and the protecting layer 130 can be applied to any embodiments and variant embodiments of the present disclosure, which will not be repeated. In some embodiments, the stretchable base 1022 can be polyimide (PI), and the supporting film 1023 can be polyethylene terephthalate (PET).

The electronic device of the present disclosure is not limited by the aforementioned embodiment and variant embodiments, and may have other different embodiments and variant embodiments. To simplify the description, the identical components in each of the following embodiments are marked with identical symbols. For making it easier to compare the difference between the embodiments, the following description will detail the dissimilarities among different embodiments and the identical features will not be redundantly described. In addition, the material and thickness of each film or layer and related fabrication process or conditions of the present disclosure may refer to the first embodiment and related variant embodiment, which will not be repeated.

Figure 9:
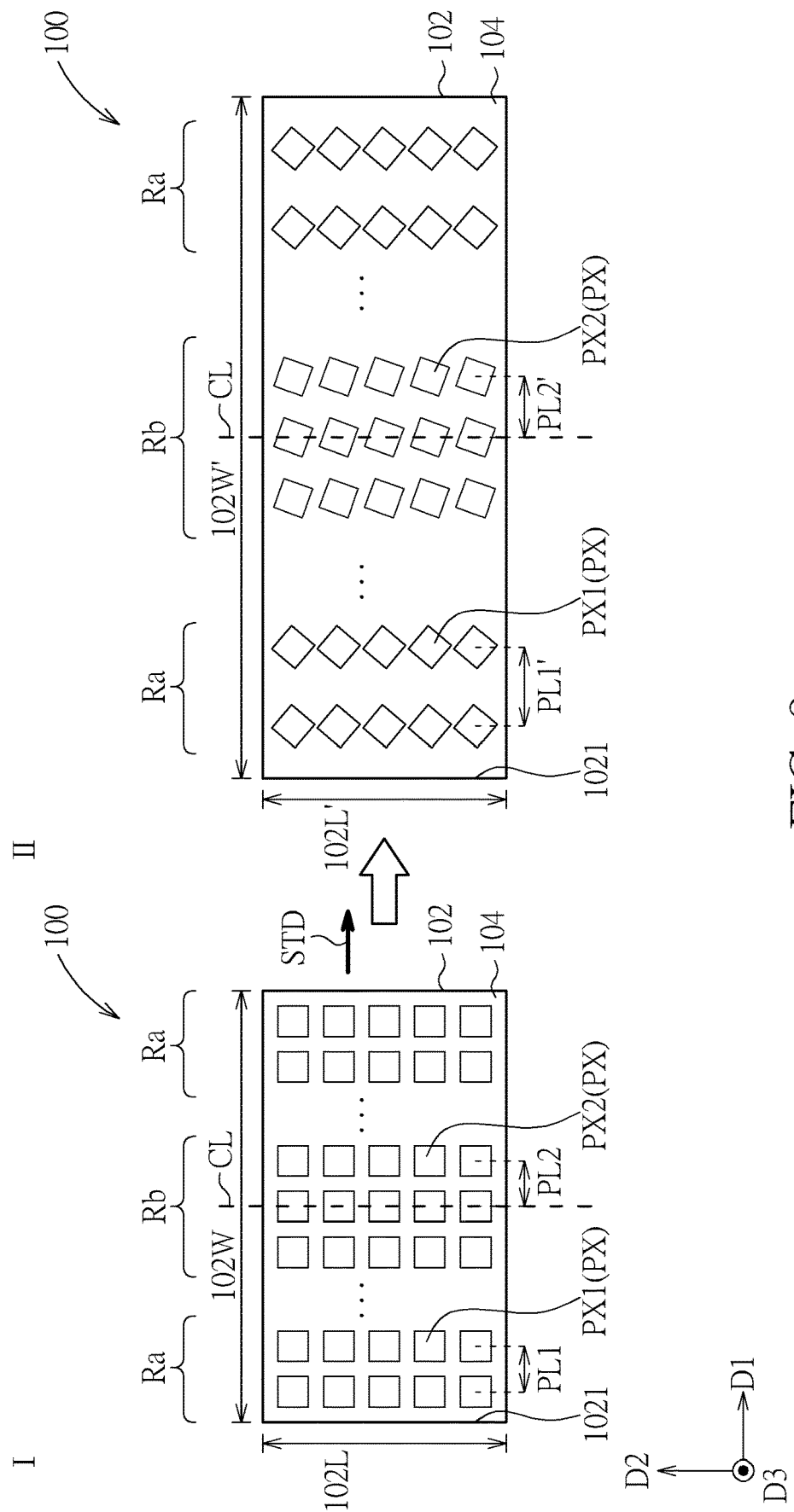
FIG. 9 is a schematic diagram illustrating different statuses of an electronic device according to a second embodiment of the present disclosure.
Figure 10:
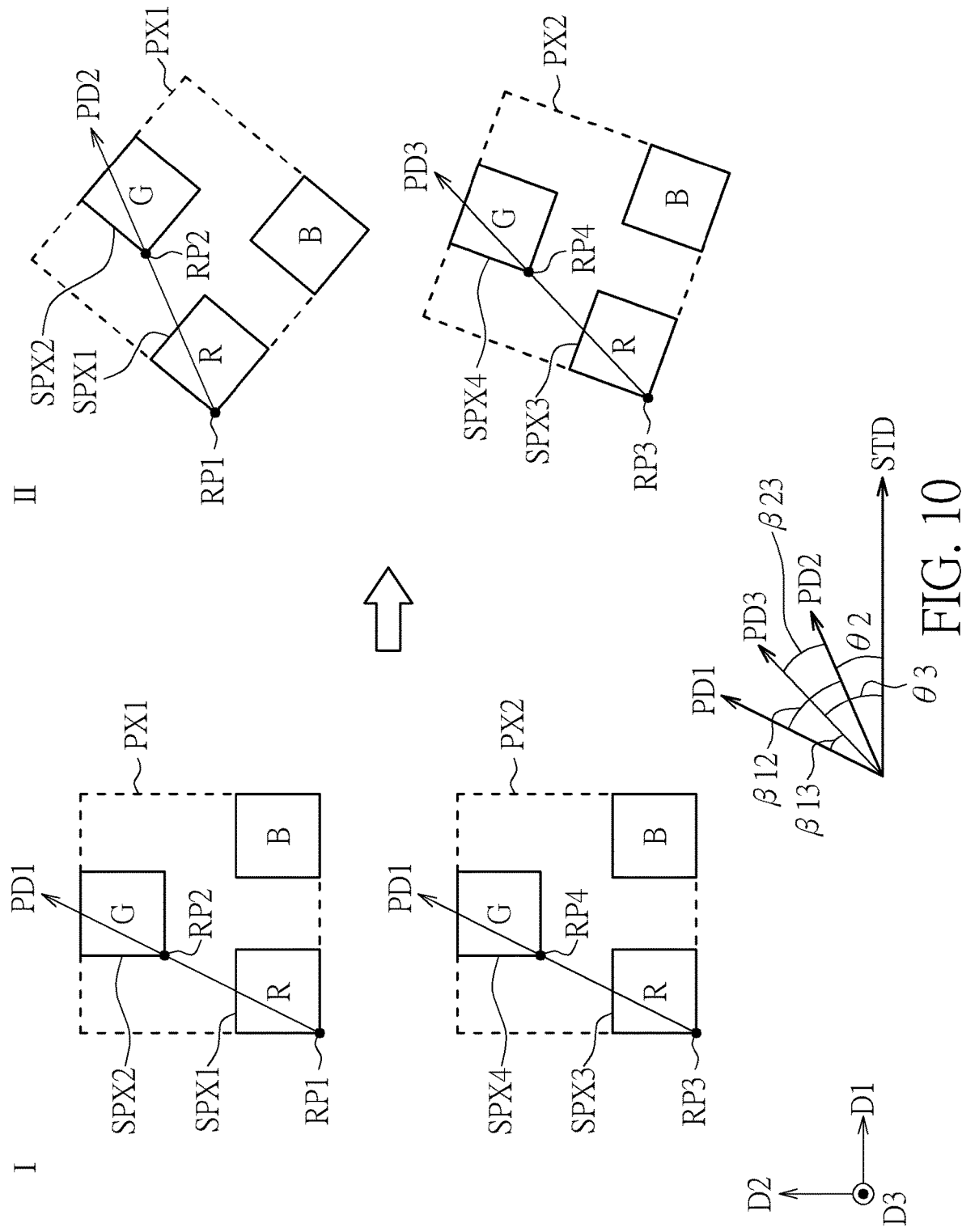
FIG. 10 is an enlargement schematic diagram illustrating the first pixel and second pixel of the electronic device shown in FIG. 9 in different statuses.

Referring to FIG. 9 and FIG. 10, FIG. 9 is a schematic diagram illustrating different statuses of an electronic device according to a second embodiment of the present disclosure and FIG. 10 is an enlargement schematic diagram illustrating the first pixel and second pixel of the electronic device shown in FIG. 9 in different statuses. Different from the first embodiment shown in FIG. 1 and FIG. 2, the pixels PX of the electronic device 100 in this embodiment may not have identical rotating degrees when the electronic device 100 is in the second status II. The first pixel PX1 is disposed in the edge region Ra and includes a first sub-pixel SPX1 and a second sub-pixel SPX2. The second pixel PX2 is disposed in the middle region Rb and includes a third sub-pixel SPX3 and a fourth sub-pixel SPX4. When the electronic device 100 is in the first status I, the first sub-pixel SPX1 and the second sub-pixel SPX2 are arranged along a first direction PD1, and the third sub-pixel SPX3 and the fourth sub-pixel SPX4 are arranged along the same direction PD1. The first direction PD1 is defined as an extending direction of the connection line of a first reference point RP1 of the first sub-pixel SPX1 and a second reference point RP2 of the second sub-pixel SPX2.

An extending direction of the connection line of a third reference point RP3 of the third sub-pixel SPX3 and a fourth reference point RP4 of the fourth sub-pixel SPX4 is also parallel to the first direction PD1. When the electronic device 100 is stretched to the second status II, both the first pixel PX1 and the second pixel PX2 rotate, such that the first sub-pixel SPX1 and the second sub-pixel SPX2 are arranged along a second direction PD2 and the third sub-pixel SPX3 and the fourth sub-pixel SPX4 are arranged along a third direction PD3. The third direction PD3 and the second direction PD2 respectively form different angles with respect to the stretching direction STD. For example, the second direction PD2 form a second angle θ2 with respect to the stretching direction STD, the third direction PD3 form a third angle θ3 with respect to the stretching direction STD, and the third angle θ3 may be greater or smaller than the second angle θ2. In some embodiments, a first included angle β23 between the second direction PD2 and the third direction PD3 is greater than 0 degree and less than or equal to 180 degrees. In some embodiments, the first included angle β23 can be greater than 0 degree and less than or equal to 90 degrees, greater than 0 degree and less than or equal to 60 degrees, greater than 0 degree and less than 30 degrees, greater than 0 degree and less than 15 degrees, or greater than 0 degree and less than 5 degrees. The second direction PD2 and the first direction PD1 have an included angle β12. The third direction PD3 and the first direction PD1 have an included angle β13. The included angle β12 is greater than the included angle β13 in this embodiment, which means rotating degree of the second pixel PX2 in the middle region Rb is less than that of the first pixel PX1 in the edge region Ra. The different rotating degrees of the first pixel PX1 and the second pixel PX2 at different locations of the electronic device 100 may make visual inequality caused by stretching more indistinct, so as to improve display performance.

Still referring to FIG. 9, when the electronic device 100 is in the first status I, two of the first pixels PX1 in the edge region Ra adjacent to each other have a first distance PL1 in the direction D1, and two of the second pixels PX2 adjacent to each other have a second distance PL2 in the direction D1. When the electronic device 100 is stretched to be in the second status II, one of the first pixels PX1 has a first stretched distance PL1' from an adjacent first pixel PX1, and one of the plurality of second pixel PX2 has a second stretched distance PL2' from an adjacent second pixel PX2. The first stretched distance PL1' is greater than the first distance PL1, and the second stretched distance PL2' is greater than the second distance PL2. In addition, the first stretched distance PL1' may be greater than or less than the second stretched distance PL2'. FIG. 9 shows that the first stretched distance PL1' is greater than the second stretched distance PL2', for example. In some variant embodiments, the first stretched distance PL1' may be approximately the same as the second stretched distance PL2'.

Figure 11:
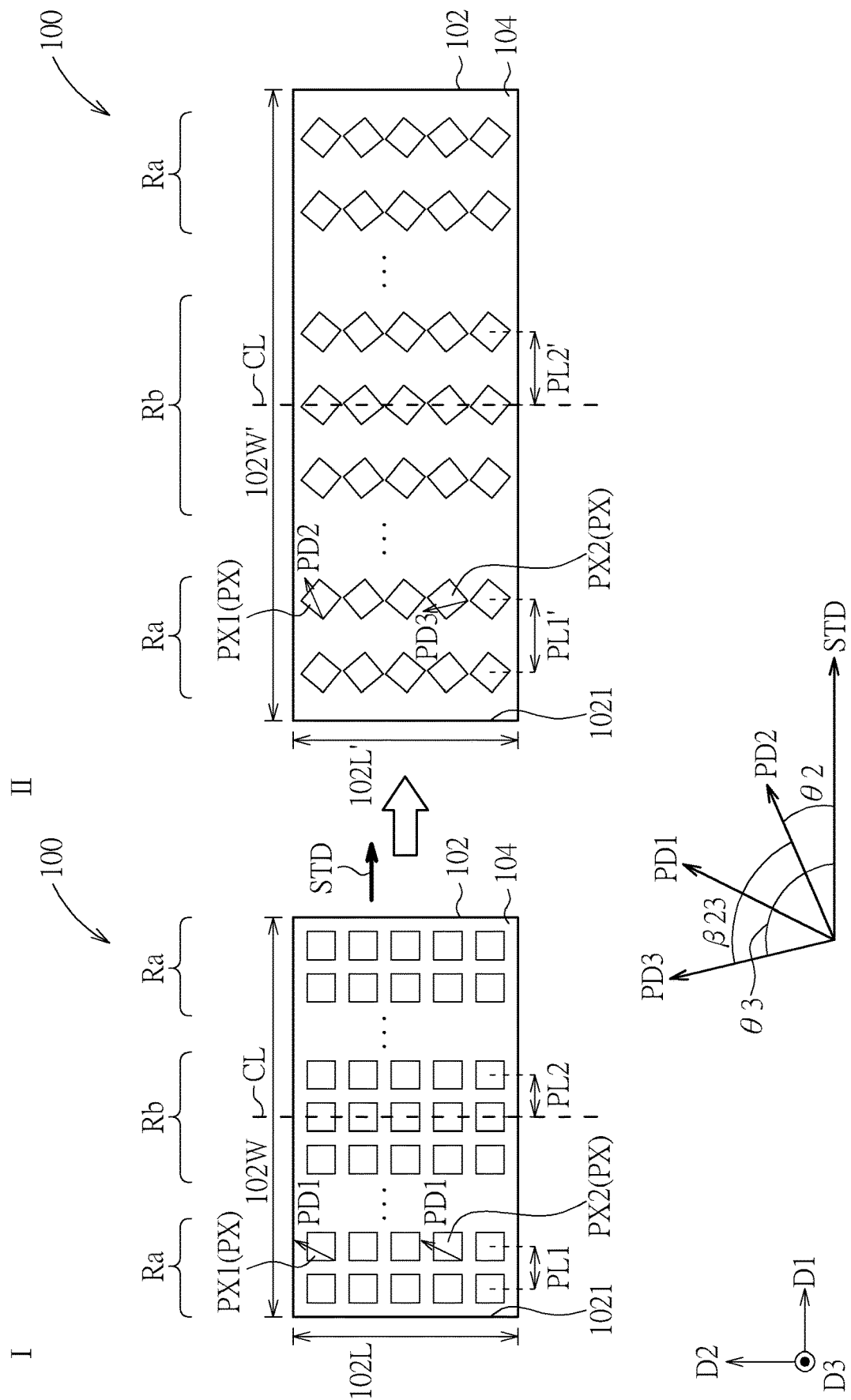
FIG. 11 is a schematic diagram illustrating different statuses of an electronic device according to a third embodiment of the present disclosure.

Referring to FIG. 11, FIG. 11 is a schematic diagram illustrating different statuses of an electronic device according to a third embodiment of the present disclosure. Different from FIG. 9, the first pixel PX1 and the second pixel PX2 are both disposed in the middle region Rb or both disposed in the edge region Ra in this embodiment. FIG. 11 illustrates that the first pixel PX1 and the second pixel PX2 are both in the edge region Ra as an example. In addition, the first pixel PX1 and the second pixel PX2 may be disposed at the same column along the direction D2. In the first status I, the first sub-pixel SPX1 and the second sub-pixel SPX2 are arranged along the first direction PD1, and the third sub-pixel SPX3 and the fourth sub-pixel SPX4 are also arranged along the first direction PD1. In the second status II, the first sub-pixel SPX1 and the second sub-pixel SPX2 are arranged along the second direction PD2, and the third sub-pixel SPX3 and the fourth sub-pixel SPX4 are arranged along the third direction PD3. The second direction PD2 form a second angle $\theta 2$ with respect to the stretching direction STD, the third direction PD3 form a third angle $\theta 3$ with respect to the stretching direction STD, and the third angle $\theta 3$ is different from the second angle $\theta 2$. For example, the third angle $\theta 3$ may be greater than the second angle $\theta 2$, but not limited thereto. In some embodiments, a first included angle $\beta 23$ between the second direction PD2 and the third direction PD3 is greater than 0 degree and less than or equal to 180 degrees. In some embodiments, the first included angle $\beta 23$ can be greater than 0 degree and less than or equal to 90 degrees, greater than 0 degree and less than or equal to 60 degrees, greater than 0 degree and less than 30 degrees, greater than 0 degree and less than 15 degrees, or greater than 0 degree and less than 5 degrees.

Figure 12:
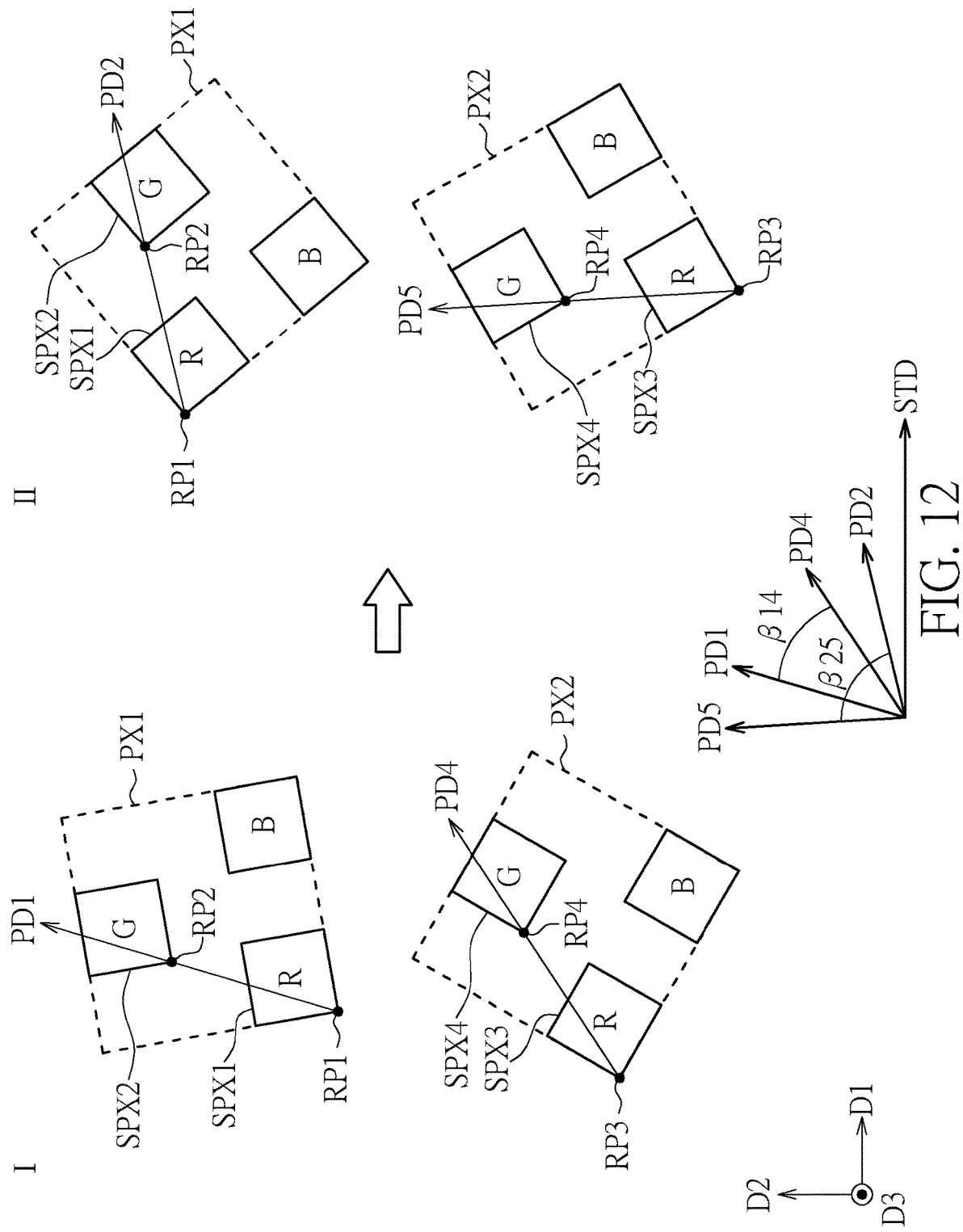
FIG. 12 is an enlargement schematic diagram illustrating the first pixel and second pixel of an electronic device according to a fourth embodiment of the present disclosure.

Referring to FIG. 12, FIG. 12 is an enlargement schematic diagram illustrating the first pixel and second pixel of an electronic device according to a fourth embodiment of the present disclosure. In this embodiment, the first pixel PX1 and the second pixel PX2 may rotate with different angles when the electronic device 100 is in the first status I. In this embodiment, the first pixel PX1 and the second pixel PX2 can be disposed on any positions on the stretchable substrate 102, and the positions are not limited. As shown in FIG. 12, in the first status I, the first sub-pixel SPX1 and the second sub-pixel SPX2 in the first pixel PX1 are arranged along the first direction PD1, the third sub-pixel SPX3 and the fourth sub-pixel SPX4 in the second pixel PX2 are arranged along a fourth direction PD4, and the first direction PD1 and the fourth direction PD4 have a second included angle $\beta 14$, wherein $0°<\beta 14 \leq 90°$. In some embodiments, the second included angle $\beta 14$ can be greater than 0 degree and less than or equal to 60 degrees, greater than 0 degree and less than 30 degrees, greater than 0 degree and less than 15 degrees, or greater than 0 degree and less than 5 degrees. When the electronic device 100 is in the second status II, the first sub-pixel SPX1 and the second sub-pixel SPX2 are arranged along a second direction PD2, the third sub-pixel SPX3 and the fourth sub-pixel SPX4 are arranged along a fifth direction PD5, and the second direction PD2 and the fifth direction PD5 have a third included angle $\beta 25$, wherein $0°<\beta 25 \leq 180°$. In some embodiments, the second included angle $\beta 14$ is smaller than the third included angle $\beta 25$, but not limited thereto. In some embodiments, the third included angle $\beta 25$ can be greater than 0 degree and less than or equal to 90 degrees, greater than 0 degree and less than or equal to 60 degrees, greater than 0 degree and less than 30 degrees, greater than 0 degree and less than 15 degrees, or greater than 0 degree and less than 5 degrees.

Figure 13:
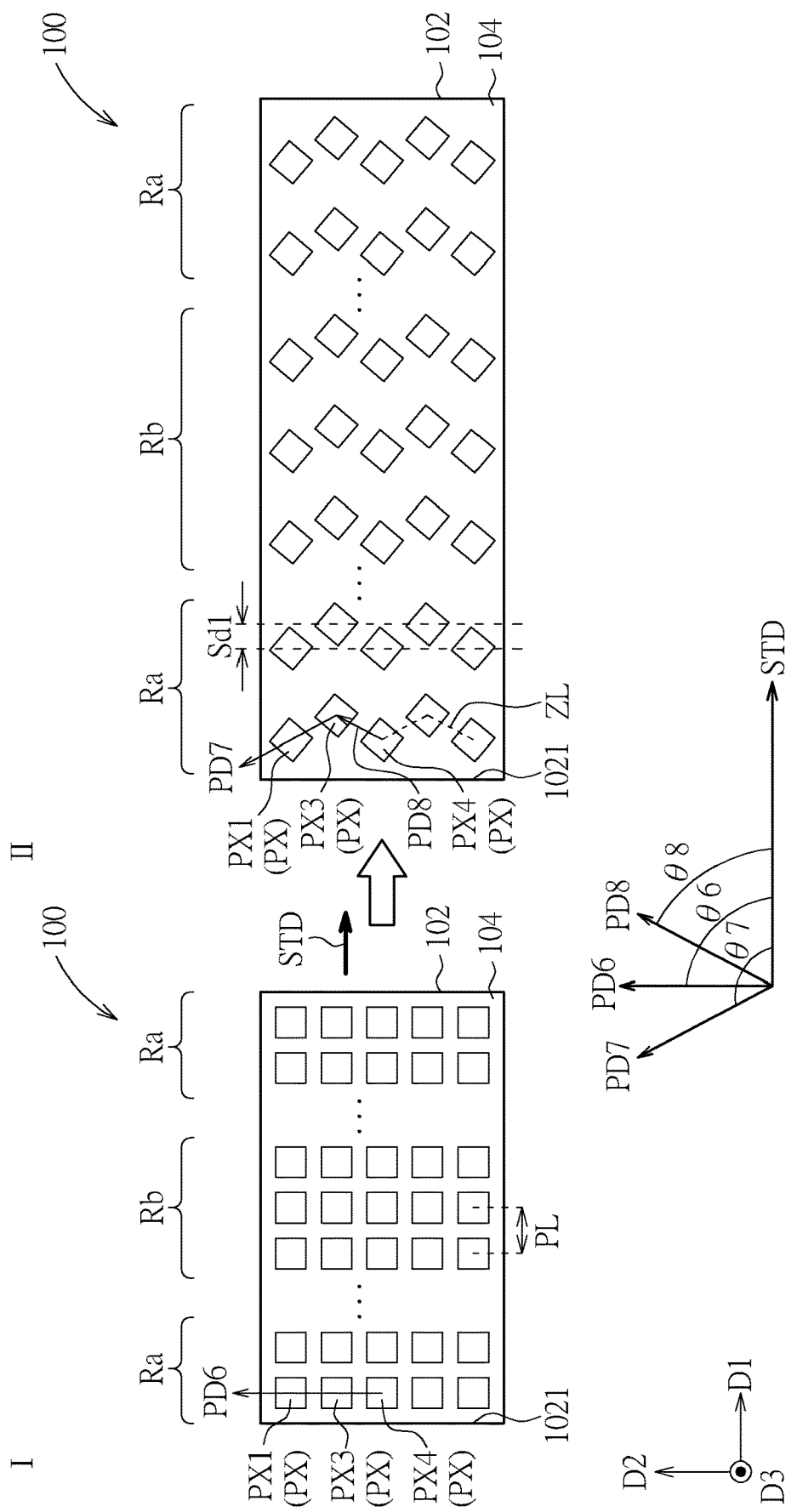
FIG. 13 is a schematic diagram illustrating different statuses of an electronic device according to a fifth embodiment of the present disclosure.

Referring to FIG. 13, FIG. 13 is a schematic diagram illustrating different statuses of an electronic device according to a fifth embodiment of the present disclosure. In this embodiment, the electronic device 100 includes a first pixel PX1, a third pixel PX3, and a fourth pixel PX4 disposed on the stretchable substrate 102, wherein the third pixel PX3 is adjacent to the first pixel PX1 and the fourth pixel PX4 is adjacent to the third pixel PX3 in the vertical direction D2. Similarly to FIG. 1, in the electronic device 100 of FIG. 13, at least one of the pixels PX is rotated or twisted after stretching in the second status II. Detailed descriptions on rotation or twist of the pixels PX are omitted for simplicity. Referring to FIG. 13, for example, the first pixel PX1, the third pixel PX3, and the fourth pixel PX4 are rotated or twisted in the second status II. The rotating degrees of the first pixel PX1, the third pixel PX3, and the fourth pixel PX4 can be the same or different.

Still referring to FIG. 13, the third pixel PX3, the fourth pixel PX4 and the first pixel PX1 are arranged along a sixth direction PD6 when the stretchable substrate 102 is not stretched, i.e. when the electronic device 100 is in the first status I. The sixth direction PD6 can be defined as an extending direction of the connection line between a center of the third pixel PX3 and a center of the first pixel PX1, and can also be defined as an extending direction of the connection line between a center of the third pixel PX3 and a center of the fourth pixel PX4. When the stretchable substrate 102 is stretched so that the electronic device 100 is in the second status II, the third pixel PX3 and the first pixel PX1 are arranged along a seventh direction PD7, and the sixth direction PD6 and the seventh direction PD7 respectively form different angles with respect to the stretching direction STD. In other words, the relative position between the first pixel PX1 and the third pixel PX3 is changed after stretching. In addition, when the electronic device 100 is in the second status II, the fourth pixel PX4 and the third pixel PX3 are arranged along an eighth direction PD8, and the sixth direction PD6 and the eighth direction PD8 respectively form different angles with respect to the stretching direction STD. In other words, the relative position between the third pixel PX3 and the fourth pixel PX4 is changed after stretching. In addition, the eighth direction PD8 and the seventh direction PD7 form different angles with respect to the stretching direction STD. As shown in FIG. 13, the sixth direction PD6 form a sixth angle $\theta 6$ with respect to the stretching direction STD, the seventh direction PD7 form a seventh angle $\theta 7$ with respect to the stretching direction STD, and the eighth direction PD8 form an eighth angle $\theta 8$ with respect to the stretching direction STD. Both the seventh angle $\theta 7$ and the eighth angle $\theta 8$ can be different from the sixth angle $\theta 6$. The seventh angle $\theta 7$ can be different from the eighth angle $\theta 8$. In other words, after stretching, the third pixel PX3 may shift in the direction D1 by a shifting distance Sd1 in the second status II. In details, in some embodiments, after stretching, the first pixel PX1 rotates but does not shift, and the shifting distance Sd1 can be measured from the center of the first pixel PX1 to the center of the shifted third pixel PX3. In the second status II, the pixels PX (such as the first pixel PX1 and the third pixel PX3) in the same column along the direction D2 may arrange as a zigzag line ZL extending along the direction D2. Compared to the non-stretching status (first status I), the relative locations of two adjacent pixels PX is changed in the stretching status (second status II) in this embodiment. In some embodiments, the pixel distance (pitch) PL of two adjacent pixels PX in two adjacent columns and the shifting distance Sd1 may meet the equation: $0.5PL<Sd1<5PL$, but not limited thereto. By the shift design of the third pixel PX3, non-uniformity of visual perception can be mitigated or prevented. For example, the bright stripes and dark stripes resulted from the enlarged pitch of the pixels may become indistinct when some of the pixels PX shift in the second status II. Therefore, the display performance may be improved.

In a variant embodiment of the fifth embodiment, different from FIG. 1 and FIG. 13, although not shown in figures, the pixels PX may not rotate when the electronic device 100 is stretched from the first status I to the second status II, but a part of the pixels PX can shift when the electronic device 100 is stretched, which may also improve the display performance.

Figure 14:
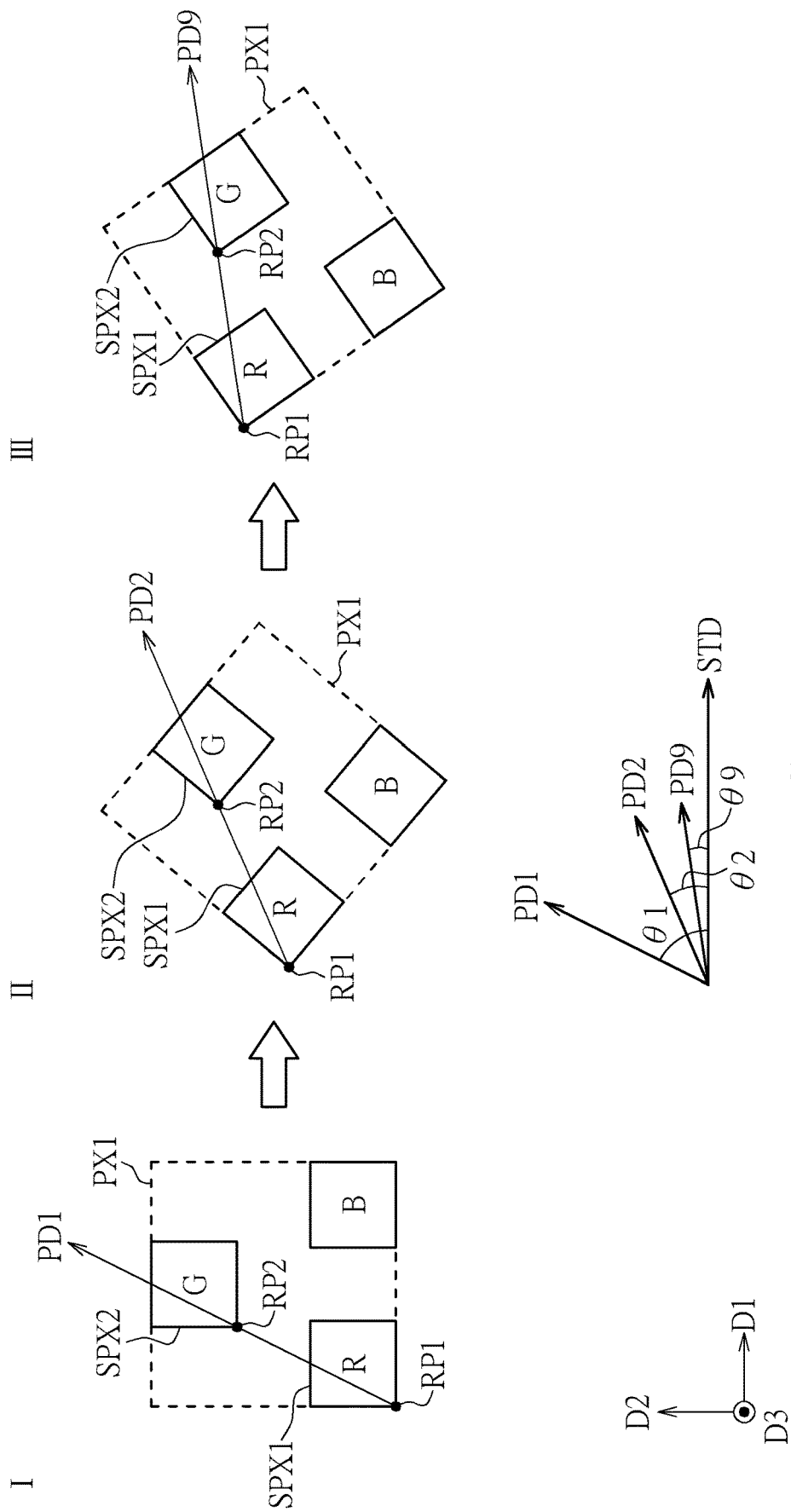
FIG. 14 is an enlargement schematic diagram illustrating the first pixel of an electronic device according to a sixth embodiment of the present disclosure.

FIG. 14 is an enlargement schematic diagram illustrating the first pixel of an electronic device according to a sixth embodiment of the present disclosure. In this embodiment, the electronic device 100 can be stretched from the first status I to the second status II and further from the second status II to the third status III. The arrangement and the rotating degree of the first status I and second status II may refer to FIG. 1 and FIG. 2. When the electronic device 100 is in the third status III, the first sub-pixel SPX1 and the second sub-pixel SPX2 are arranged along a ninth direction PD9, wherein the ninth direction PD9 and the second direction PD2 respectively form different angles with respect to the stretching direction STD. As shown in FIG. 14, the ninth direction PD9 form an eighth angle θ9 with the stretching direction STD, and the ninth angle θ9 is different from the second angle θ2 which is the included angle of the second direction PD2 and the stretching direction STD.

Figure 15:
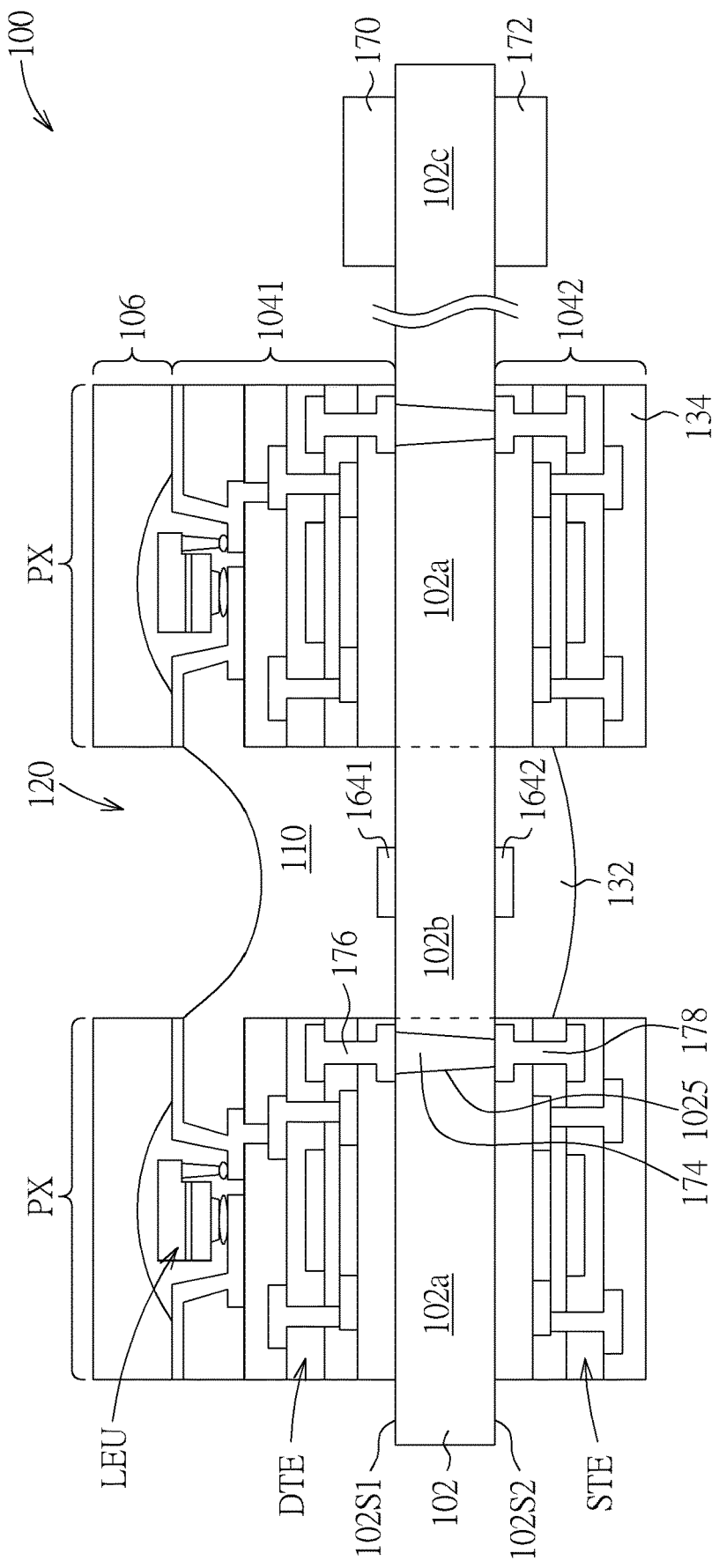
FIG. 15 is a partial schematic sectional-view diagram of an electronic device according to a seventh embodiment of the present disclosure.

Referring to FIG. 15, FIG. 15 is a partial schematic sectional-view diagram of an electronic device according to a seventh embodiment of the present disclosure. The top-view of the electronic device 100 of this embodiment may refer to FIG. 5 and FIG. 6. The stretchable substrate 102 has a first surface 102S1 and a second surface 102S2 opposite to the first surface 102S1. The electronic device 100 has a first circuit layer 1041 disposed on the first surface 102S1 and a second circuit layer 1042 disposed on the second surface 102S2. As mentioned in the descriptions related to FIG. 3 and FIG. 7, the first circuit layer 1041 may include circuits, wires, electrodes, switch elements, driving elements, light emitting elements, and/or any other suitable elements. FIG. 15 illustrates that the first circuit layer 1041 includes light emitting elements LEU and driving elements DTE in the pixel parts 102a and a wire 1641 (such as a signal line) in the connecting part 102b on the first surface 102S1, but not limited thereto. The second circuit layer 1042 may also include circuits, wires, electrodes, switch elements, driving elements, and/or any other suitable elements. For example, the second circuit layer 1042 may include switching elements STE in the pixel parts 102a and a wire 1642 in the connecting part 102b on the second surface 102S2. The driving elements DTE and the switching elements STE may include thin film transistors. In addition, a protecting layer 132 may be disposed on the second surface 102S2 to protect the wire 1642 (such as a signal line) from air and moisture. The second circuit layer 1042 may include an insulating layer 134 to cover the switching elements STE and other elements. One or more through-holes 1025 may be formed in the stretchable substrate 102 and may pass through the stretchable substrate 102 from the first surface 102S1 to the second surface 102S2. The second circuit layer 1042 may be electrically connected to the first circuit layer 1041 through one or more conductive connections 174 filled in the through-holes 1025. The conductive connection 174 in the through-hole 1025 may be electrically connected between a first plug 176 (or a wire) on the first surface 102S1 and a second plug 178 (or a wire) on the second surface 102S2 in order to electrically connect the first circuit layer 1041 and the second circuit layer 1042. Furthermore, the stretchable substrate 102 may include a periphery part 102c, and one or more IC chip may be disposed in the periphery part 102c. In FIG. 15, an IC chip 170 is disposed on the first surface 102S1, and an IC chip 172 is disposed on the second surface 102S2. The double-side structure of disposing two circuit layers on two surfaces of the stretchable substrate 102 can save the arrangement area of the electric elements, especially when the stretchable substrate 102 has a plurality of openings 1021.

Figure 16:
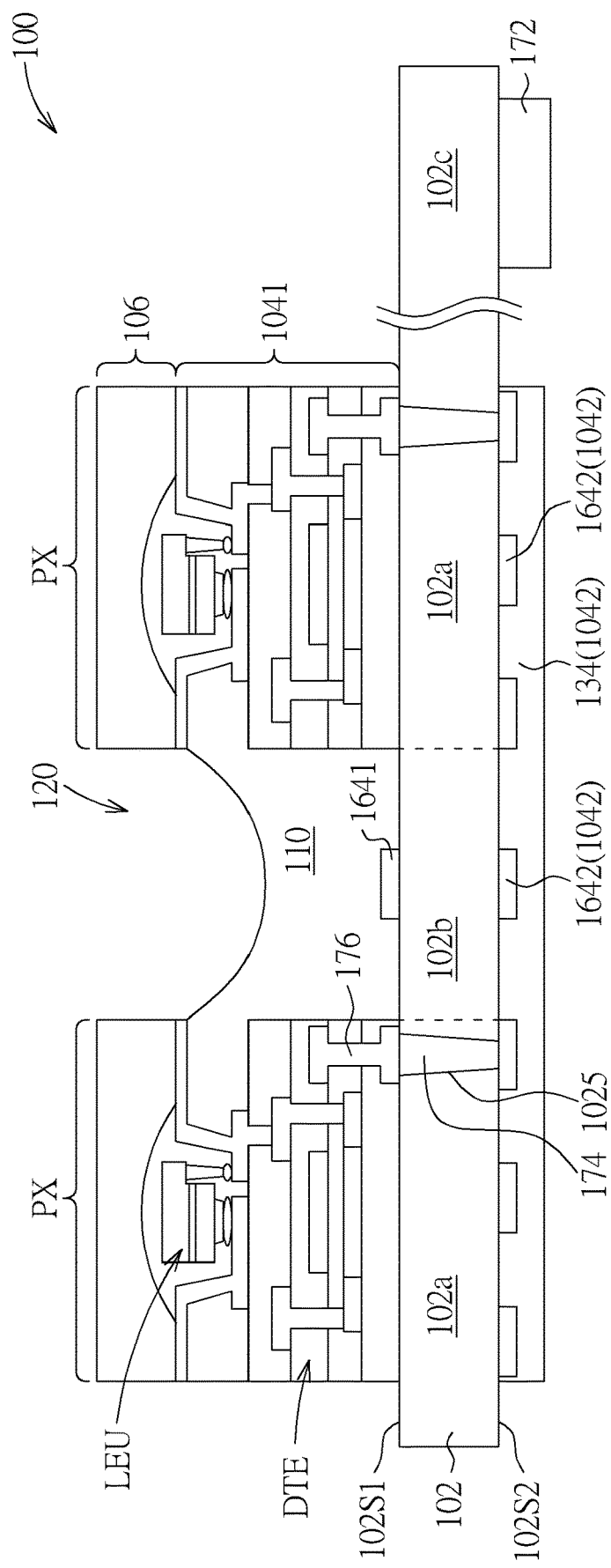
FIG. 16 is a partial schematic sectional-view diagram of an electronic device according to an eighth embodiment of the present disclosure.

Referring to FIG. 16, FIG. 16 is a partial schematic sectional-view diagram of an electronic device according to an eighth embodiment of the present disclosure. The top-view of the electronic device 100 of this embodiment may refer to FIG. 5 and FIG. 6. FIG. 16 is different from FIG. 15 in that the second circuit layer 1042 of FIG. 16 includes a plurality of wires 1642 disposed both in the pixel parts 102a and the connecting parts 102b, replacing the switching element STE in FIG. 15. An insulating layer 134 can be formed on the second surface 102S2 to cover the wires 1642, which may provide protection function to the wires 1642. In addition, the IC chip 172 can be disposed on the second surface 102S2, rather than the first surface 102S1 in order to save the area of the first surface 102S1.

According to the present disclosure, a stretchable electronic device is provided. When the electronic device is stretched from the first status to the second status, one or more of the pixels can rotate and/or shift, such that the relative positions of pixels may be adjusted. Thus, in some embodiments, non-uniformity of visual perception can be mitigated or prevented, and display performance can be enhanced.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device capable of being stretched from a first status to a second status, comprising:
   a stretchable substrate stretchable in a stretching direction, wherein the stretchable substrate includes a plurality of pixel parts and a plurality of connecting parts, and one of the plurality of connecting parts is disposed between two adjacent ones of the plurality of pixel parts; and
   a first pixel disposed on one of the plurality of pixel parts of the stretchable substrate, comprising a first sub-pixel and a second sub-pixel, wherein the first sub-pixel and the second sub-pixel are arranged along a first direction when the electronic device is in the first status, and the first sub-pixel and the second sub-pixel are arranged along a second direction when the electronic device is in the second status,
   wherein the first direction and the second direction form different angles with respect to the stretching direction.

2. The electronic device of claim 1, wherein the first direction forms a first angle with respect to the stretching direction, the second direction forms a second angle with respect to the stretching direction, wherein an absolute difference between the first angle and the second angle is greater than zero and less than or equal to 120 degrees.

3. The electronic device of claim 1, further comprising a second pixel disposed on the stretchable substrate, the second pixel comprising a third sub-pixel and a fourth sub-pixel, wherein the third sub-pixel and the fourth sub-pixel are arranged along the first direction when the electronic device is in the first status, the third sub-pixel and the fourth sub-pixel are arranged along a third direction when the electronic device is in the second status, wherein the third direction and the second direction form different angles with respect to the stretching direction.

4. The electronic device of claim 3, wherein a first included angle between the second direction and the third direction is greater than 0 degree and less than or equal to 180 degrees.

5. The electronic device of claim 1, further comprising a second pixel disposed on the stretchable substrate, the second pixel comprising a third sub-pixel and a fourth sub-pixel, wherein the third sub-pixel and the fourth sub-pixel are arranged along a fourth direction when the electronic device is in the first status, the third sub-pixel and the fourth sub-pixel are arranged along a fifth direction when the electronic device is in the second status, wherein the fourth direction and the first direction has a second included angle greater than 0° and less than or equal to 90°.

6. The electronic device of claim 1, further comprising a third pixel disposed on the stretchable substrate, the third pixel being adjacent to the first pixel, wherein the third pixel and the first pixel are arranged along a sixth direction when the electronic device is in the first status, the third pixel and the first pixel are arranged along a seventh direction when the electronic device is in the second status, and wherein the sixth direction and the seventh direction form different angles with respect to the stretching direction.

7. The electronic device of claim 6, further comprising a fourth pixel disposed on the stretchable substrate, the fourth pixel being adjacent to the third pixel, wherein the fourth pixel and the third pixel are arranged along the sixth direction when the electronic device is in the first status, the fourth pixel and the third pixel are arranged along an eighth direction when the electronic device is in the second status, and wherein the eighth direction and the seventh direction form different angles with respect to the stretching direction.

8. The electronic device of claim 1, capable of being stretched from the second status to a third status, wherein the first sub-pixel and the second sub-pixel are arrange along a ninth direction when the electronic device is in the third status, wherein the ninth direction and the second direction form different angles with respect to the stretching direction.

9. The electronic device of claim 1, wherein the stretchable substrate has a substrate area and the first pixel has a first pixel area when the electronic device is in the first status, the stretchable substrate has a stretched substrate area and the first pixel has a second pixel area when the electronic device is in the second status, and the substrate area is different from the stretched substrate area, wherein a ratio of the first pixel area to the substrate area is greater than a ratio of the second pixel area to the stretched substrate area.

10. The electronic device of claim 1, wherein the stretchable substrate includes a plurality of openings.

11. The electronic device of claim 1, wherein a thickness of one of the plurality of pixel parts is greater than a thickness of one of the plurality of connecting parts.

12. The electronic device of claim 1, wherein the stretchable substrate has a first surface, a second surface opposite to the first surface, and a through-hole penetrating through the stretchable substrate, and the electronic device further comprises:
  a first circuit layer disposed on the first surface; and
  a second circuit layer disposed on the second surface, wherein the second circuit layer is electrically connected to the first circuit layer through the through-hole.

13. The electronic device of claim 1, wherein the first sub-pixel and the second sub-pixel are of different colors.

14. The electronic device of claim 13, wherein the first pixel comprising a plurality of first sub-pixels and a plurality of second sub-pixels.

15. An electronic device capable of being stretched from a first status to a second status, comprising:
  a stretchable substrate stretchable in a stretching direction;
  a first pixel disposed on the stretchable substrate, comprising a first sub-pixel and a second sub-pixel, wherein the first sub-pixel and the second sub-pixel are arranged along a first direction when the electronic device is in the first status, and the first sub-pixel and the second sub-pixel are arranged along a second direction when the electronic device is in the second status, wherein the first direction and the second direction form different angles with respect to the stretching direction; and
  a second pixel disposed on the stretchable substrate, the second pixel comprising a third sub-pixel and a fourth sub-pixel, wherein the third sub-pixel and the fourth sub-pixel are arranged along a fourth direction when the electronic device is in the first status, the third sub-pixel and the fourth sub-pixel are arranged along a fifth direction when the electronic device is in the second status, wherein the fourth direction and the first direction have a second included angle greater than 0° and less than or equal to 90°.

16. The electronic device of claim 15, wherein the fifth direction and the second direction have a third included angle greater than 0° and less than or equal to 180°.

17. The electronic device of claim 16, wherein the second included angle is less than the third included angle.

18. An electronic device capable of being stretched from a first status to a second status, comprising:
  a stretchable substrate stretchable in a stretching direction;
  a first pixel disposed on the stretchable substrate, comprising a first sub-pixel and a second sub-pixel, wherein the first sub-pixel and the second sub-pixel are arranged along a first direction when the electronic device is in the first status, and the first sub-pixel and the second sub-pixel are arranged along a second direction when the electronic device is in the second status, wherein the first direction and the second direction form different angles with respect to the stretching direction; and
  a second pixel disposed on the stretchable substrate, the second pixel comprising a third sub-pixel and a fourth sub-pixel, wherein the third sub-pixel and the fourth sub-pixel are arranged along the first direction when the electronic device is in the first status, the third sub-pixel and the fourth sub-pixel are arranged along a third direction when the electronic device is in the second status, wherein the third direction and the second direction form different angles with respect to the stretching direction.

19. The electronic device of claim 18, wherein the stretchable substrate has an edge region and a middle region arranged along the stretching direction, the first pixel is disposed in the edge region, and the second pixel is disposed in the middle region.

20. The electronic device of claim 19, wherein an included angle between the first direction and the second direction is greater than an included angle between the first direction and the third direction.

\* \* \* \* \*